(12) United States Patent
Riemer et al.

(10) Patent No.: US 10,818,979 B2
(45) Date of Patent: *Oct. 27, 2020

(54) SINGLE SIDED REUSABLE BATTERY INDICATOR

(71) Applicant: DURACELL U.S. OPERATIONS, INC., Wilmington, DE (US)

(72) Inventors: Joern Riemer, Santa Clara, CA (US); Robert Pavlinsky, Oxford, CT (US); Jordan Bourilkov, Bethany, CT (US); Steven J. Specht, Brookfield, CT (US); George Turco, Wilmington, DE (US); Sergio Coronado, Bethel, CT (US)

(73) Assignee: DURACELL U.S. OPERATIONS, INC., Wilmington, DE (US)

( * ) Notice: Subject to any disclaimer, the term of this patent is extended or adjusted under 35 U.S.C. 154(b) by 29 days.

This patent is subject to a terminal disclaimer.

(21) Appl. No.: 15/340,731

(22) Filed: Nov. 1, 2016

(65) Prior Publication Data
US 2018/0123174 A1 May 3, 2018

(51) Int. Cl.
*H01M 10/42* (2006.01)
*G01R 31/364* (2019.01)
(Continued)

(52) U.S. Cl.
CPC ........ *H01M 10/425* (2013.01); *G01R 31/364* (2019.01); *G01R 31/371* (2019.01);
(Continued)

(58) Field of Classification Search
CPC .............. G01R 31/362; G01R 31/3686; G01R 31/3689; G01R 31/3696; H01M 10/425;
(Continued)

(56) References Cited

U.S. PATENT DOCUMENTS 3,354,565 A 11/1967 Emmons et al.
3,992,228 A 11/1976 Depoix
(Continued)

FOREIGN PATENT DOCUMENTS

CN 1084281 A 3/1994
CN 1163020 A 10/1997
(Continued)

OTHER PUBLICATIONS

Atmel Corporation, Application Note AVR400: Low Cost A/D Converter, available at http://www.atmel.com/images/doc0942.pdf (last visited Oct. 24, 2013).
(Continued)

*Primary Examiner* — Victoria H Lynch
(74) *Attorney, Agent, or Firm* — Marshall, Gerstein & Borun LLP

(57) ABSTRACT

A reusable battery indicator includes a voltage sensor, a communication circuit communicatively connected to the voltage sensor, an antenna operatively coupled to the communication circuit, and a connection mechanism having a first connector and a retainer. The first connector and the retainer are electrically connected to the voltage sensor, and the first connector is adapted to be removably connected to a first battery terminal, thereby providing an electrical connection between the voltage sensor and the first battery terminal. The retainer is adapted to removably secure the voltage sensor to a can of a battery, thereby providing an electrical connection between the voltage sensor and the can of the battery. An electrical circuit is completed between the voltage sensor and the first battery terminal and between the voltage sensor and the can.

19 Claims, 7 Drawing Sheets

(51) Int. Cl.
  *G01R 31/371* (2019.01)
  *G01R 31/3835* (2019.01)
  *H01M 2/02* (2006.01)
  *H04W 4/70* (2018.01)
  *H04L 29/08* (2006.01)
  *H01M 10/48* (2006.01)

(52) U.S. Cl.
  CPC ...... *G01R 31/3835* (2019.01); *H01M 2/0285* (2013.01); *H01M 10/4285* (2013.01); *H01M 10/48* (2013.01); *H04L 67/125* (2013.01); *H04W 4/70* (2018.02); *H01M 2010/4278* (2013.01)

(58) Field of Classification Search
  CPC ............. H01M 10/4285; H01M 10/48; H01M 2010/4278; H01M 2/0285; H04L 67/125; H04W 4/70
  See application file for complete search history.

(56) References Cited

U.S. PATENT DOCUMENTS

| | | |
|---|---|---|
| 3,993,985 A | 11/1976 | Chopard et al. |
| 4,117,475 A | 9/1978 | Ebihara et al. |
| 4,149,146 A | 4/1979 | Ebihara et al. |
| 4,238,554 A | 12/1980 | Barrella |
| 4,302,751 A | 11/1981 | Nakauchi et al. |
| 4,460,870 A | 7/1984 | Finger |
| 4,482,615 A | 11/1984 | Rosansky et al. |
| 4,598,243 A | 7/1986 | Kawakami |
| 4,654,280 A | 3/1987 | Bailey |
| 4,759,765 A | 7/1988 | Van Kampen |
| 4,808,497 A | 2/1989 | Blomgren et al. |
| 4,860,185 A | 8/1989 | Brewer et al. |
| 4,952,330 A | 8/1990 | Leger et al. |
| 5,015,544 A | 5/1991 | Burroughs et al. |
| 5,032,825 A | 7/1991 | Kuznicki |
| 5,188,231 A * | 2/1993 | Kivell .................... B65D 75/54 206/459.1 |
| 5,200,686 A | 4/1993 | Lee |
| 5,219,683 A | 6/1993 | Webber |
| 5,231,356 A | 7/1993 | Parker |
| 5,250,905 A | 10/1993 | Kuo et al. |
| 5,290,414 A | 3/1994 | Marple |
| 5,339,024 A | 8/1994 | Kuo et al. |
| 5,355,089 A | 10/1994 | Treger |
| 5,366,832 A | 11/1994 | Hayashi et al. |
| 5,389,458 A | 2/1995 | Weiss et al. |
| 5,389,470 A | 2/1995 | Parker et al. |
| 5,396,177 A | 3/1995 | Kuo et al. |
| 5,418,086 A | 5/1995 | Bailey |
| 5,424,722 A | 6/1995 | Inada et al. |
| 5,438,607 A | 8/1995 | Przygoda, Jr. et al. |
| 5,458,992 A | 10/1995 | Bailey |
| 5,458,997 A | 10/1995 | Crespi et al. |
| 5,491,038 A | 2/1996 | DePalma et al. |
| 5,494,496 A | 2/1996 | Huhndorff et al. |
| 5,514,491 A | 5/1996 | Webber |
| 5,525,439 A | 6/1996 | Huhndorff et al. |
| 5,543,246 A | 8/1996 | Treger |
| 5,569,556 A | 10/1996 | Bohmer |
| 5,587,573 A | 12/1996 | Owen et al. |
| 5,596,278 A | 1/1997 | Lin |
| 5,607,790 A | 3/1997 | Hughen et al. |
| 5,627,472 A | 5/1997 | Ofer et al. |
| 5,633,592 A | 5/1997 | Lang |
| 5,640,150 A | 6/1997 | Atwater |
| 5,654,640 A | 8/1997 | Bailey |
| 5,691,083 A | 11/1997 | Bolster |
| 5,737,114 A | 4/1998 | Bailey |
| 5,786,106 A | 7/1998 | Armani |
| 5,798,933 A | 8/1998 | Nicolai |
| 5,849,046 A | 12/1998 | Bailey |
| 5,925,479 A | 7/1999 | Wei et al. |
| 5,959,568 A | 9/1999 | Woolley |
| 5,963,012 A | 10/1999 | Garcia et al. |
| 6,014,014 A | 1/2000 | Owen et al. |
| 6,084,523 A | 7/2000 | Gelnovatch et al. |
| 6,127,062 A | 10/2000 | Sargeant et al. |
| 6,143,439 A | 11/2000 | Yoppolo et al. |
| 6,156,450 A | 12/2000 | Bailey |
| 6,169,397 B1 | 1/2001 | Steinbach et al. |
| 6,171,729 B1 | 1/2001 | Gan et al. |
| 6,208,235 B1 | 3/2001 | Trontelj |
| 6,218,054 B1 | 4/2001 | Webber |
| 6,252,377 B1 | 6/2001 | Shibutani et al. |
| 6,275,161 B1 | 8/2001 | Wan et al. |
| 6,300,004 B1 | 10/2001 | Tucholski |
| 6,407,534 B1 | 6/2002 | Mukainakano |
| 6,469,471 B1 | 10/2002 | Anbuky et al. |
| 6,483,275 B1 | 11/2002 | Nebrigic et al. |
| 6,587,250 B2 | 7/2003 | Armgarth et al. |
| 6,617,069 B1 | 9/2003 | Hopper et al. |
| 6,617,072 B2 | 9/2003 | Venkatesan et al. |
| 6,627,353 B1 | 9/2003 | Munshi |
| 6,670,073 B2 | 12/2003 | Tucholski et al. |
| RE38,518 E | 5/2004 | Tucholski |
| 6,730,136 B2 | 5/2004 | Webber |
| 6,774,685 B2 | 8/2004 | O'Toole et al. |
| 6,775,562 B1 | 8/2004 | Owens et al. |
| 6,849,360 B2 | 2/2005 | Marple |
| 6,979,502 B1 | 12/2005 | Gartstein et al. |
| 6,990,171 B2 | 1/2006 | Toth et al. |
| 7,067,882 B2 | 6/2006 | Singh |
| 7,079,079 B2 | 7/2006 | Jo et al. |
| 7,157,185 B2 | 1/2007 | Marple |
| 7,386,404 B2 | 6/2008 | Cargonja et al. |
| 7,474,230 B2 | 1/2009 | Blom et al. |
| 7,489,431 B2 | 2/2009 | Malmstrom et al. |
| 7,511,454 B1 | 3/2009 | Legg |
| 7,561,050 B2 | 7/2009 | Bhogal et al. |
| 7,576,517 B1 | 8/2009 | Cotton et al. |
| 7,586,416 B2 | 9/2009 | Ariyoshi et al. |
| 7,598,880 B2 | 10/2009 | Powell et al. |
| 7,606,530 B1 | 10/2009 | Anderson et al. |
| 7,715,884 B2 | 5/2010 | Book et al. |
| 7,741,970 B2 | 6/2010 | Cunningham et al. |
| 7,745,046 B2 | 6/2010 | Kim et al. |
| 7,768,236 B2 | 8/2010 | Takamura et al. |
| 7,772,850 B2 | 8/2010 | Bertness |
| 7,805,263 B2 | 9/2010 | Mack |
| 7,911,182 B2 | 3/2011 | Cargonja et al. |
| 7,944,368 B2 | 5/2011 | Carter et al. |
| 8,031,054 B2 | 10/2011 | Tuttle |
| 8,106,845 B2 | 1/2012 | Savry |
| 8,119,286 B2 | 2/2012 | Issaev et al. |
| 8,131,486 B2 | 3/2012 | Leonard et al. |
| 8,344,685 B2 | 1/2013 | Bertness et al. |
| 8,368,356 B2 | 2/2013 | Nakashima et al. |
| 8,374,507 B2 | 2/2013 | Hudson et al. |
| 8,424,092 B2 | 4/2013 | Ikeuchi et al. |
| 8,427,109 B2 | 4/2013 | Melichar |
| 8,471,888 B2 | 6/2013 | George et al. |
| 8,652,670 B2 | 2/2014 | Uchida |
| 8,653,926 B2 | 2/2014 | Detcheverry et al. |
| 8,900,731 B2 | 12/2014 | Bohne |
| 8,905,317 B1 | 12/2014 | Hsu et al. |
| 9,037,426 B2 | 5/2015 | Schaefer |
| 9,060,213 B2 | 6/2015 | Jones |
| 9,076,092 B2 | 7/2015 | Ritamaki et al. |
| 9,083,063 B2 | 7/2015 | Specht et al. |
| 9,146,595 B2 | 9/2015 | Forutanpour et al. |
| 9,167,317 B2 | 10/2015 | DeMar |
| 9,189,667 B2 | 11/2015 | Bourilkov et al. |
| 9,235,044 B2 | 1/2016 | Specht et al. |
| 9,297,859 B2 | 3/2016 | Mukaitani et al. |
| 9,312,575 B2 | 4/2016 | Stukenberg et al. |
| 9,331,378 B2 | 5/2016 | Merlin et al. |
| 9,425,487 B2 | 8/2016 | Bertness |
| 9,453,885 B2 | 9/2016 | Mukaitani et al. |
| 9,459,323 B2 | 10/2016 | Mukaitani et al. |
| 9,461,339 B2 | 10/2016 | Roohparvar |
| 9,478,850 B2 | 10/2016 | Bourilkov et al. |

(56) References Cited

U.S. PATENT DOCUMENTS

| | | |
|---|---|---|
| 9,551,758 B2 | 1/2017 | Bourilkov et al. |
| 9,568,556 B2 | 2/2017 | Bourilkov et al. |
| 9,619,612 B2 | 4/2017 | Kallfelz et al. |
| 9,639,724 B2 | 5/2017 | Bourilkov et al. |
| 9,661,576 B2 | 5/2017 | Tomisawa |
| 9,699,818 B2 | 7/2017 | Grothaus et al. |
| 9,726,763 B2 | 8/2017 | Dempsey et al. |
| 9,739,837 B2 | 8/2017 | Bourilkov et al. |
| 9,746,524 B2 | 8/2017 | Petrucelli |
| 9,774,210 B1 | 9/2017 | Wright |
| 9,823,310 B2 | 11/2017 | Bourilkov et al. |
| 9,841,462 B2 | 12/2017 | Kim et al. |
| 9,843,220 B2 | 12/2017 | Herrmann et al. |
| 9,869,726 B2 | 1/2018 | Zumstein et al. |
| 9,882,250 B2 | 1/2018 | Chappelle et al. |
| 9,887,463 B2 | 2/2018 | Bourilkov et al. |
| 9,893,390 B2 | 2/2018 | Specht et al. |
| 9,983,312 B2 | 5/2018 | Dempsey et al. |
| 10,094,886 B2 | 10/2018 | Bourilkov et al. |
| 10,151,802 B2 | 12/2018 | Riemer et al. |
| 10,184,988 B2 | 1/2019 | Bourilkov et al. |
| 10,297,875 B2 | 5/2019 | Riemer et al. |
| 10,416,309 B2 | 9/2019 | Dempsey et al. |
| 10,483,634 B2 | 11/2019 | Bourilkov et al. |
| 2001/0005123 A1 | 6/2001 | Jones et al. |
| 2001/0026226 A1 | 10/2001 | Andersson et al. |
| 2002/0001745 A1 | 1/2002 | Gartstein et al. |
| 2002/0086718 A1 | 7/2002 | Bigwood et al. |
| 2003/0070283 A1 | 4/2003 | Webber |
| 2003/0169047 A1 | 9/2003 | Chen |
| 2003/0170537 A1 | 9/2003 | Randell |
| 2003/0184493 A1 | 10/2003 | Robinet et al. |
| 2003/0228518 A1 | 12/2003 | Marple |
| 2004/0029007 A1 | 2/2004 | Kusumoto et al. |
| 2004/0048512 A1 | 3/2004 | Chen |
| 2004/0183742 A1 | 9/2004 | Goff et al. |
| 2005/0038614 A1 | 2/2005 | Botts et al. |
| 2005/0073282 A1 | 4/2005 | Carrier et al. |
| 2005/0095508 A1 | 5/2005 | Yamamoto |
| 2005/0112462 A1 | 5/2005 | Marple |
| 2005/0162129 A1 | 7/2005 | Mutabdzija et al. |
| 2005/0233214 A1 | 10/2005 | Marple et al. |
| 2005/0258797 A1* | 11/2005 | Hung ............... H02J 7/0054 320/105 |
| 2005/0277023 A1 | 12/2005 | Marple et al. |
| 2006/0017581 A1 | 1/2006 | Schwendinger et al. |
| 2006/0028179 A1 | 2/2006 | Yudahira et al. |
| 2006/0043933 A1 | 3/2006 | Latinis |
| 2006/0046152 A1 | 3/2006 | Webber |
| 2006/0046153 A1 | 3/2006 | Webber |
| 2006/0046154 A1 | 3/2006 | Webber et al. |
| 2006/0047576 A1 | 3/2006 | Aaltonen et al. |
| 2006/0163692 A1 | 7/2006 | Detecheverry et al. |
| 2006/0168802 A1 | 8/2006 | Tuttle |
| 2006/0170397 A1 | 8/2006 | Srinivasan et al. |
| 2006/0208898 A1 | 9/2006 | Swanson et al. |
| 2006/0247156 A1 | 11/2006 | Vanderby et al. |
| 2006/0261960 A1 | 11/2006 | Haraguchi et al. |
| 2007/0080804 A1 | 4/2007 | Hirahara et al. |
| 2007/0096697 A1 | 5/2007 | Maireanu |
| 2007/0108946 A1 | 5/2007 | Yamauchi et al. |
| 2007/0182576 A1 | 8/2007 | Proska et al. |
| 2007/0210924 A1 | 9/2007 | Arnold et al. |
| 2007/0273329 A1 | 11/2007 | Kobuse et al. |
| 2008/0053716 A1 | 3/2008 | Scheucher |
| 2008/0076029 A1 | 3/2008 | Bowden et al. |
| 2008/0079391 A1 | 4/2008 | Schroeck et al. |
| 2008/0157924 A1 | 7/2008 | Batra |
| 2008/0160392 A1 | 7/2008 | Toya et al. |
| 2008/0206627 A1 | 8/2008 | Wright |
| 2008/0218351 A1 | 9/2008 | Corrado et al. |
| 2008/0252462 A1 | 10/2008 | Sakama |
| 2009/0008031 A1 | 1/2009 | Gould et al. |
| 2009/0009177 A1 | 1/2009 | Kim et al. |
| 2009/0024309 A1 | 1/2009 | Crucs |
| 2009/0041228 A1 | 2/2009 | Owens et al. |
| 2009/0098462 A1 | 4/2009 | Fujiwara et al. |
| 2009/0148756 A1 | 6/2009 | Specht et al. |
| 2009/0155673 A1 | 6/2009 | Northcott |
| 2009/0179763 A1* | 7/2009 | Sheng ............... G01R 31/385 340/636.1 |
| 2009/0214950 A1 | 8/2009 | Bowden et al. |
| 2009/0263727 A1 | 10/2009 | Josephs et al. |
| 2009/0273473 A1 | 11/2009 | Tuttle |
| 2009/0289825 A1 | 11/2009 | Trinkle |
| 2009/0297949 A1 | 12/2009 | Berkowitz et al. |
| 2009/0308936 A1 | 12/2009 | Nitzan et al. |
| 2010/0019733 A1 | 1/2010 | Rubio |
| 2010/0030592 A1 | 2/2010 | Evans et al. |
| 2010/0073003 A1 | 3/2010 | Sakurai et al. |
| 2010/0081049 A1 | 4/2010 | Holl et al. |
| 2010/0085008 A1 | 4/2010 | Suzuki et al. |
| 2010/0087241 A1 | 4/2010 | Nguyen et al. |
| 2010/0143753 A1 | 6/2010 | Kim et al. |
| 2010/0209744 A1 | 8/2010 | Kim |
| 2010/0219252 A1 | 9/2010 | Kikuchi et al. |
| 2010/0295943 A1 | 11/2010 | Cha et al. |
| 2010/0308974 A1 | 12/2010 | Rowland et al. |
| 2011/0018777 A1 | 1/2011 | Brown |
| 2011/0023130 A1 | 1/2011 | Gudgel et al. |
| 2011/0104520 A1 | 5/2011 | Ahn |
| 2011/0123874 A1 | 5/2011 | Issaev et al. |
| 2011/0163752 A1 | 7/2011 | Janousek et al. |
| 2011/0293969 A1 | 12/2011 | Hoofman et al. |
| 2012/0021266 A1 | 1/2012 | Marple et al. |
| 2012/0056002 A1 | 3/2012 | Ritamaki et al. |
| 2012/0081774 A1 | 4/2012 | De Paiva Martins et al. |
| 2012/0086615 A1 | 4/2012 | Norair |
| 2012/0121943 A1 | 5/2012 | Roohparvar |
| 2012/0183862 A1 | 7/2012 | Gupta et al. |
| 2012/0190305 A1 | 7/2012 | Wuidart |
| 2012/0206102 A1 | 8/2012 | Okamura et al. |
| 2012/0206302 A1 | 8/2012 | Ramachandran et al. |
| 2012/0217971 A1 | 8/2012 | Deluca |
| 2012/0235870 A1 | 9/2012 | Forster |
| 2012/0277832 A1 | 11/2012 | Hussain |
| 2012/0299597 A1 | 11/2012 | Shigemizu |
| 2012/0323511 A1 | 12/2012 | Saigo et al. |
| 2013/0069768 A1 | 3/2013 | Madhyastha et al. |
| 2013/0117595 A1 | 5/2013 | Murawski et al. |
| 2013/0127611 A1 | 5/2013 | Bernstein et al. |
| 2013/0148283 A1 | 6/2013 | Forutanpour et al. |
| 2013/0154652 A1 | 6/2013 | Rice et al. |
| 2013/0161380 A1 | 6/2013 | Joyce et al. |
| 2013/0162402 A1 | 6/2013 | Amann et al. |
| 2013/0162403 A1 | 6/2013 | Striemer et al. |
| 2013/0162404 A1 | 6/2013 | Striemer et al. |
| 2013/0164567 A1 | 6/2013 | Olsson et al. |
| 2013/0171479 A1* | 7/2013 | Kim ............... H01Q 1/243 429/7 |
| 2013/0183568 A1 | 7/2013 | Babinec et al. |
| 2013/0185008 A1 | 7/2013 | Itabashi et al. |
| 2013/0271072 A1 | 10/2013 | Lee et al. |
| 2013/0295421 A1 | 11/2013 | Teramoto et al. |
| 2013/0320989 A1 | 12/2013 | Inoue et al. |
| 2014/0062663 A1 | 3/2014 | Bourilkov et al. |
| 2014/0139380 A1 | 5/2014 | Ouyang et al. |
| 2014/0188413 A1 | 7/2014 | Bourilkov et al. |
| 2014/0197802 A1 | 7/2014 | Yamazaki |
| 2014/0229129 A1 | 8/2014 | Campbell et al. |
| 2014/0302348 A1 | 10/2014 | Specht et al. |
| 2014/0302351 A1 | 10/2014 | Specht et al. |
| 2014/0320144 A1 | 10/2014 | Nakaya |
| 2014/0342193 A1 | 11/2014 | Mull et al. |
| 2014/0346873 A1 | 11/2014 | Colangelo et al. |
| 2014/0347249 A1* | 11/2014 | Bourilkov ............... H01Q 1/38 343/904 |
| 2014/0370344 A1 | 12/2014 | Lovelace et al. |
| 2014/0379285 A1 | 12/2014 | Dempsey et al. |
| 2015/0061603 A1 | 3/2015 | Loftus et al. |
| 2015/0064524 A1 | 3/2015 | Noh et al. |
| 2015/0072181 A1 | 3/2015 | Roohparvar |
| 2015/0162649 A1 | 6/2015 | Bae et al. |
| 2015/0349391 A1 | 12/2015 | Chappelle et al. |

(56) References Cited

U.S. PATENT DOCUMENTS

| | | |
|---|---|---|
| 2015/0357685 A1 | 12/2015 | Iwasawa et al. |
| 2016/0034733 A1 | 2/2016 | Bourilkov et al. |
| 2016/0049695 A1 | 2/2016 | Lim et al. |
| 2016/0064781 A1 | 3/2016 | Specht et al. |
| 2016/0092847 A1 | 3/2016 | Buchbinder |
| 2016/0137088 A1 | 5/2016 | Lim et al. |
| 2016/0154025 A1* | 6/2016 | Song .............. G01R 15/16 324/126 |
| 2016/0277879 A1 | 9/2016 | Daoura et al. |
| 2017/0040698 A1 | 2/2017 | Bourilkov et al. |
| 2017/0062841 A1 | 3/2017 | Riemer et al. |
| 2017/0062880 A1 | 3/2017 | Riemer et al. |
| 2017/0092994 A1 | 3/2017 | Canfield et al. |
| 2017/0125855 A1 | 5/2017 | Gong et al. |
| 2017/0176539 A1 | 6/2017 | Younger |
| 2017/0286918 A1 | 10/2017 | Westermann et al. |
| 2017/0301961 A1 | 10/2017 | Kim et al. |
| 2017/0315183 A1 | 11/2017 | Chao et al. |
| 2017/0331162 A1 | 11/2017 | Clarke et al. |
| 2018/0040929 A1 | 2/2018 | Chappelle et al. |
| 2018/0088182 A1 | 3/2018 | Bourilkov et al. |
| 2018/0120386 A1 | 5/2018 | Riemer et al. |
| 2018/0123175 A1 | 5/2018 | Riemer et al. |
| 2018/0123176 A1 | 5/2018 | Riemer et al. |
| 2018/0123233 A1 | 5/2018 | Bourilkov et al. |
| 2018/0159225 A1 | 6/2018 | Bourilkov et al. |
| 2019/0113579 A1 | 4/2019 | Riemer et al. |
| 2019/0137572 A1 | 5/2019 | Bourilkov et al. |
| 2020/0011997 A1 | 1/2020 | Dempsey et al. |

FOREIGN PATENT DOCUMENTS

| | | |
|---|---|---|
| CN | 1228540 A | 9/1999 |
| CN | 1315072 A | 9/2001 |
| CN | 1529182 A | 9/2004 |
| CN | 2828963 Y | 10/2006 |
| CN | 101126795 A | 2/2008 |
| CN | 201142022 Y | 10/2008 |
| CN | 201233435 Y | 5/2009 |
| CN | 101702792 A | 5/2010 |
| CN | 101785164 A | 7/2010 |
| CN | 102097844 A | 6/2011 |
| CN | 102142186 A | 8/2011 |
| CN | 102544709 A | 7/2012 |
| CN | 202308203 U | 7/2012 |
| CN | 202720320 U | 2/2013 |
| CN | 202856390 U | 4/2013 |
| CN | 103682482 A | 3/2014 |
| CN | 104635169 A | 5/2015 |
| CN | 105337367 A | 2/2016 |
| CN | 205160145 U | 4/2016 |
| CN | 106405241 A | 2/2017 |
| CN | 106848448 A | 6/2017 |
| CN | 107284272 A | 10/2017 |
| CN | 206804833 U | 12/2017 |
| DE | 10118027 A1 | 11/2002 |
| DE | 10118051 A1 | 11/2002 |
| EP | 0523901 A1 | 1/1993 |
| EP | 1450174 A1 | 8/2004 |
| EP | 1693807 A1 | 8/2006 |
| EP | 1786057 A2 | 5/2007 |
| EP | 1821363 A1 | 8/2007 |
| EP | 2065962 A1 | 6/2009 |
| EP | 2204873 A1 | 7/2010 |
| EP | 2324535 A1 | 5/2011 |
| EP | 2328223 A1 | 6/2011 |
| EP | 2645447 A1 | 10/2013 |
| EP | 2680093 A2 | 1/2014 |
| EP | 2790262 A1 | 10/2014 |
| EP | 3128599 A1 | 2/2017 |
| JP | S52005581 A | 1/1977 |
| JP | 61169781 | 7/1986 |
| JP | 02142324 | 5/1990 |
| JP | H03131771 A | 6/1991 |
| JP | H06284170 A | 10/1994 |
| JP | H09005366 A | 1/1997 |
| JP | 10014003 | 1/1998 |
| JP | 2000077928 A | 3/2000 |
| JP | 2001022905 A | 1/2001 |
| JP | 2004085580 A | 3/2004 |
| JP | 2004-253858 A | 9/2004 |
| JP | 2004534430 A | 11/2004 |
| JP | 2005327099 A | 11/2005 |
| JP | 2006139544 A | 6/2006 |
| JP | 2006284431 A | 10/2006 |
| JP | 2006324074 A | 11/2006 |
| JP | 2007515848 A | 6/2007 |
| JP | 2007171045 A | 7/2007 |
| JP | 2008042985 A | 2/2008 |
| JP | 2008-530682 A | 8/2008 |
| JP | 2008181855 A | 8/2008 |
| JP | 2009-37374 | 2/2009 |
| JP | 2010098361 A | 4/2010 |
| JP | 2010-154012 A | 7/2010 |
| JP | 2011113759 A | 6/2011 |
| JP | 2011203595 A | 10/2011 |
| JP | 2012/0056002 A | 3/2012 |
| JP | 2012085491 A | 4/2012 |
| JP | 2012-129183 A | 7/2012 |
| JP | 2012161614 A | 8/2012 |
| JP | 2012170262 A | 9/2012 |
| JP | 2013-038967 A | 2/2013 |
| JP | 2013038961 A | 2/2013 |
| JP | 2013120640 A | 6/2013 |
| KR | 2011-0018488 A | 2/2011 |
| TW | M510009 U | 10/2015 |
| TW | I580153 B | 4/2017 |
| WO | WO-95/01062 A1 | 1/1995 |
| WO | WO-03/047064 A2 | 6/2003 |
| WO | WO-2004/047215 A1 | 6/2004 |
| WO | WO-2004/107251 A2 | 12/2004 |
| WO | WO-2005/078673 A1 | 8/2005 |
| WO | WO-2006/048838 A1 | 5/2006 |
| WO | WO-2006/085291 A2 | 8/2006 |
| WO | WO-2008/151181 A1 | 12/2008 |
| WO | WO-2008/156735 A1 | 12/2008 |
| WO | WO-2010/127509 A1 | 11/2010 |
| WO | WO-2011/063679 A1 | 6/2011 |
| WO | WO-2011/096863 A1 | 8/2011 |
| WO | WO-2012/051272 A2 | 4/2012 |
| WO | WO-2012/061262 A1 | 5/2012 |
| WO | WO-2012/070635 A1 | 5/2012 |
| WO | WO-2012/083759 A1 | 6/2012 |
| WO | WO-2013/022857 A2 | 2/2013 |
| WO | WO-2013/024341 A1 | 2/2013 |
| WO | WO-2013/069423 A1 | 5/2013 |
| WO | WO-2013/084481 A1 | 6/2013 |
| WO | WO-2013/101652 A1 | 7/2013 |
| WO | WO-2015/183609 A1 | 12/2015 |
| WO | WO-2016/146006 A1 | 9/2016 |
| WO | WO-2016/166735 A1 | 10/2016 |
| WO | WO-2016/172542 A1 | 10/2016 |

OTHER PUBLICATIONS

Yamashiro, Voltage Detecting Circuit, Japanese Patent No. 52005581, Hitashi Ltd., (Jan. 17, 1977), Translated by the United States Patent and Trademark Office via Phoenix Translations (Elgin, TX) in Feb. 2018.

International Application No. PCT/US2017/059474, International Search Report and Written Opinion, dated Jan. 19, 2018.

Kooser, Tethercell magically turns AA batteries into Bluetooth devices, CNET.com, downloaded from the Internet at: <https://www.cnet.com/news/tethercell-magically-turns-aa-batteries-into-bluetooth-devices/> (Jan. 8, 2013).

Tethercell Smart Battery Adapter fundraising campaign on Indiegogo website (<https://www.indiegogo.com/projects/tethercell-smart-battery-adapter#/>) (launched Oct. 2013).

Tethercell video uploaded at <https://vimeo.com/53823785> (Oct. 2012).

U.S. Appl. No. 15/340,737, "Positive Battery Terminal Antenna Ground Plane", filed Nov. 1, 2016.

(56) References Cited

OTHER PUBLICATIONS

U.S. Appl. No. 15/340,757, "Dual Sided Reusable Battery Indicator", filed Nov. 1, 2016.
U.S. Appl. No. 15/340,773, "Reusable Battery Indicator with Lock and Key Mechanism", filed Nov. 1, 2016.
U.S. Appl. No. 15/340,789, "Reusable Battery Indicator with Electrical Lock and Key", filed Nov. 1, 2016.
International Application No. PCT/US2017/059474, Written Opinion of the International Preliminary Examining Authority, dated Nov. 23, 2018.
International Preliminary Report on Patentability (IPRP) for International Appl. No. PCT/US2017/059474, dated Feb. 18, 2019.

* cited by examiner

SINGLE SIDED REUSABLE BATTERY INDICATOR

FIELD OF THE INVENTION

The disclosure relates generally to battery indicators and, more specifically, relates to a single sided reusable battery characteristic indicator.

BACKGROUND OF THE INVENTION

Electrochemical cells, or batteries, are commonly used as electrical energy sources. A battery contains a negative electrode, typically called the anode, and a positive electrode, typically called the cathode. The anode contains an electrochemically active anode material that can be oxidized. The cathode contains an electrochemically active cathode material that can be reduced. The electrochemically active anode material is capable of reducing the electrochemically active cathode material. A separator is disposed between the anode and the cathode. The battery components are disposed in a can, or housing, that is typically made from metal.

When a battery is used as an electrical energy source in an electronic device, electrical contact is made to the anode and the cathode, thereby completing a circuit that allows electrons to flow through the device, and which results in respective oxidation and reduction reactions that produce electrical power to the electronic device. An electrolyte is in contact with the anode, the cathode, and the separator. The electrolyte contains ions that flow through the separator between the anode and cathode to maintain charge balance throughout the battery during discharge.

There is a growing need for portable power for electronic devices such as toys; remote controls; audio devices; flashlights; digital cameras and peripheral photography equipment; electronic games; toothbrushes; radios; clocks, and other portable electronic devices. Consumers need to have power readily available for these electronic devices. Because batteries necessarily become depleted of power over time as they are used, consumers need to have access to spare batteries (and/or access to fully recharged rechargeable batteries). It is helpful for a consumer to know the power state of a battery currently in use so that the consumer can have quick access to the needed number of replacement batteries. Batteries come in common sizes, such as the AA, AAA, AAAA, C, and D battery sizes, that have fixed external dimensions and constrained internal volumes, per ANSI standard.

Currently, some batteries include on-cell battery charge indicators to help a consumer determine when a battery is nearly depleted and in need of replacement. However, these current on-cell battery charge indicators are single use (i.e., attached to a single battery cell) and cumbersome (because typically two contact buttons must be simultaneously depressed to activate the indicator). Additionally, these on-cell battery indicators require removal of the battery from an electronic device (or package) in order to use the indicator.

SUMMARY OF THE INVENTION

According to some aspects, a reusable battery indicator includes a voltage sensor configured to convert sensed analog characteristics of a battery to digital information; a communication circuit communicatively connected to the voltage sensor; an antenna operatively coupled to the communication circuit; and a connection mechanism having a first connector and a retainer. The first connector and the retainer are electrically connected to the voltage sensor, and the first connector is adapted to be removably connected to a first battery terminal, thereby providing an electrical connection between the voltage sensor and the first battery terminal when the first connector is connected to the first battery terminal. The retainer is adapted to removably secure the voltage sensor to a can of a battery, thereby providing an electrical connection between the voltage sensor and the can of the battery. An electrical circuit is completed between the voltage sensor and the first battery terminal and between the voltage sensor and the can when the connection mechanism is coupled to the first battery terminal and to the can.

According to another aspect, a remote battery indication system includes a battery and a reusable battery indicator. The reusable battery indicator includes a voltage sensor that is configured to convert sensed analog characteristics of a battery to digital information f; a communication circuit communicatively connected to the voltage sensor; an antenna operatively coupled to the communication circuit; and a connection mechanism having a first connector and a retainer. The first connector and the retainer are electrically connected to the voltage sensor. The first connector is adapted to be removably connected to a first battery terminal, thereby providing an electrical connection between the voltage sensor and the first battery terminal when the first connector is connected to the first battery terminal. The retainer is adapted to removably secure the voltage sensor to a can of a battery, thereby providing an electrical connection between the voltage sensor and the can of the battery. The first connector is electrically attached to a first battery terminal, so that the voltage sensor senses a characteristic of the battery.

In accordance with the teachings of the disclosure, any one or more of the foregoing aspects of a reusable battery indicator or a remote battery indication system may further include any one or more of the following optional forms.

In some optional forms, the first connector is connected to a negative electrode of a battery and the retainer is connected to a positive electrode of the battery.

In other optional forms, the first connector is one of a formed spring, a Kelvin connection including separate power and sensing terminals to measure impedance, a split wire, a leaf spring, and combinations thereof.

In yet other optional forms, a voltage booster is electrically connected to or incorporated in the voltage sensor.

In yet other optional forms, the first connector comprises at least one metal and at least one insulator.

In yet other optional forms, the communication circuit comprises at least one of radio-frequency identification circuitry, Bluetooth circuitry, Bluetooth low energy circuitry, Wi-Fi circuitry, Zigbee circuitry, LORA circuitry, and Z-wave circuitry.

In yet other optional forms, the voltage sensor is capable of reading an open circuit voltage of less than 1.8 Volts.

In yet other optional forms, the voltage sensor and the communication circuit are formed on a printed circuit board that is adapted to be inserted between the first connector and the first retainer.

In yet other optional forms, the voltage sensor and the communication circuit are mounted within a housing, the housing being sized and shaped to fit between two cylindrical batteries that are arranged side-by-side.

In yet other optional forms, the housing has a cross-section that is in the shape of a triangular prism.

In yet other optional forms, the housing has one side that is concave or two sides that are concave.

In yet other optional forms, the housing has a volume of between about 102 mm$^3$ and about 165 mm$^3$.

In yet other optional forms, the voltage sensor is disc-shaped to and arranged to fit one end of a cylindrical battery cell.

In yet other optional forms, the voltage sensor is a thin disc BLE, UHF, or RF module.

In other optional forms, a computing device is communicatively connected to the communication circuit, and the computing device receives information from the communication circuit through the antenna.

In yet other optional forms, the computing device includes a processor and a memory, the memory storing a software routine that causes the processor to detect a wireless communication signal from the reusable battery indicator, to remotely control battery circuitry through the reusable battery indicator to determine battery characteristic data; and to send the battery characteristic data to a user interface.

In yet other optional forms, the battery characteristic data comprises at least one of an electrical capacity; a voltage; an impedance, a temperature, a current; an age, a charge/discharge cycle count, and a coulomb count.

In yet other optional forms, the software routine, when executed by the processor, causes the processor to determine at least one of a battery type, a physical location of the battery, and an electrical device that the battery is powering.

BRIEF DESCRIPTION OF THE DRAWINGS

While the specification concludes with claims particularly pointing out and distinctly claiming the subject matter, which is regarded as forming the present invention, the invention will be better understood from the following description taken in conjunction with the accompanying drawings.

DETAILED DESCRIPTION OF THE INVENTION

Electrochemical cells, or batteries, may be primary or secondary. Primary batteries are meant to be discharged, e.g., to exhaustion, only once and then discarded. Primary batteries (or disposable batteries) are described, for example, in David Linden, *Handbook of Batteries* (4$^{th}$ ed. 2011). Secondary batteries (or rechargeable batteries) are intended to be recharged and used over and over again. Secondary batteries may be discharged and recharged many times, e.g., more than fifty times, a hundred times, or more. Secondary batteries are described, for example, in David Linden, *Handbook of Batteries* (4$^{th}$ ed. 2011). Accordingly, batteries may include various electrochemical couples and electrolyte combinations. Although the description and examples provided herein are generally directed towards primary alkaline electrochemical cells, or batteries, it should be appreciated that the invention applies to both primary and secondary batteries of aqueous, nonaqueous, ionic liquid, and solid state systems. For example, in addition to being a primary battery such as a primary alkaline battery, the battery may be a primary lithium-ion battery. Alternatively, the battery can be a secondary battery, for example, a secondary battery such as a nickel metal hydride (NiMH) battery, a nickel cadmium (NiCad) battery, a silver/zinc battery, a nickel/zinc battery, or a lithium solid state rechargeable battery. Primary and secondary batteries of the aforementioned systems are thus within the scope of this application and the invention is not limited to any particular embodiment.

Figure 1:
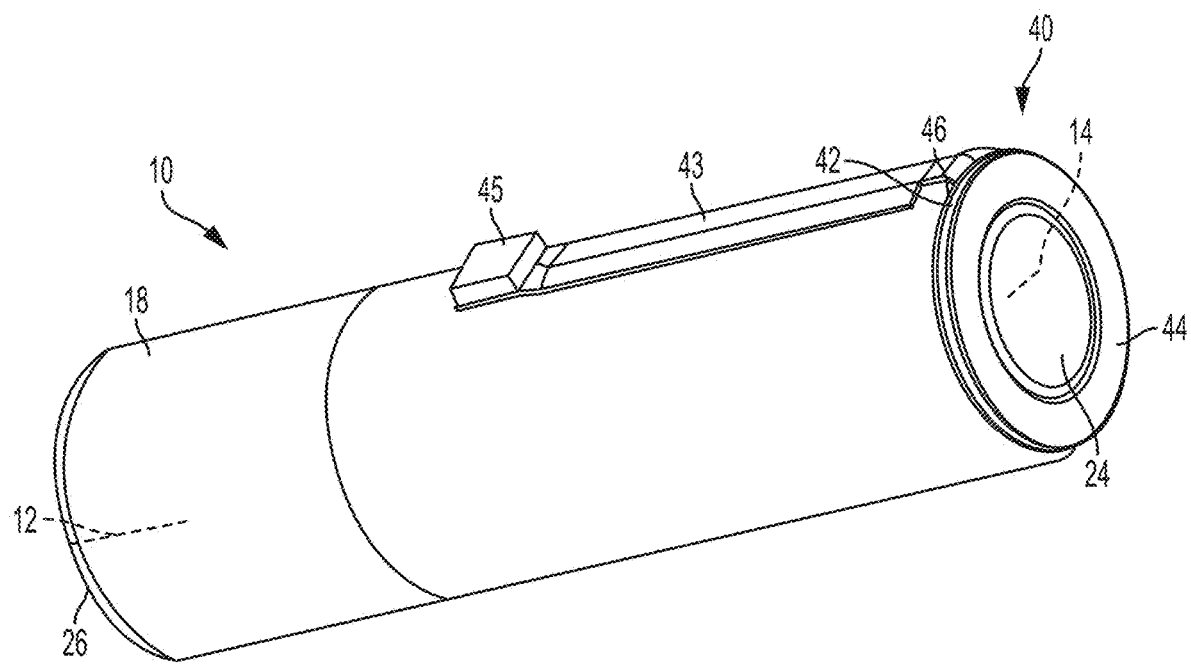
FIG. 1 is a perspective view of a reusable battery indicator constructed in accordance with the teachings of the disclosure, the reusable battery indicator being connected to a battery cell.

Referring to FIG. 1 a primary alkaline electrochemical cell, or battery cell 10, is illustrated that includes a cathode 12, an anode 14, and a housing 18. The battery cell 10 also includes an end cap 24. The end cap 24 serves as a negative terminal of the battery cell 10. A positive pip 26 is located at the opposite end of the battery cell 10 from the end cap 24. The positive pip 26 serves as a positive terminal of the battery cell 10. An electrolytic solution is dispersed throughout the battery cell 10. The battery cell 10 can be, for example, a AA, AAA, AAAA, C, or D alkaline battery. Additionally, in other embodiments, the battery cell 10 can be a 9V battery, a camera battery, a watch battery, or any other type of primary or secondary battery.

The housing 18 can be made of any suitable type of housing base material, for example cold-rolled steel or nickel-plated cold-rolled steel. In the embodiment illustrated in FIG. 1, the housing 18 may have a cylindrical shape. In other embodiments, the housing 18 may have any other suitable, non-cylindrical shape. The housing 18, for example, may have a shape comprising at least two parallel plates, such as a rectangular, square, or prismatic shape. The housing 18 may be, for example, deep-drawn from a sheet of the base material, such as cold-rolled steel or nickel-plated steel. The housing 18 may be, for example, drawn into a cylindrical shape. The housing 18 may have a sidewall. The interior surface of the sidewall of the housing 18 may be treated with a material that provides a low electrical-contact resistance between the interior surface of the sidewall of the housing 18 and an electrode, such as the cathode 12. The interior surface of the sidewall of the housing 18 may be plated, e.g., with nickel, cobalt, and/or painted with a carbon-loaded paint to decrease contact resistance between, for example, the internal surface of the sidewall of the housing 18 and the cathode 12.

Attached to the battery cell 10 is one embodiment of a communication mechanism, such as a reusable battery indicator 40. The reusable battery indicator 40 attaches to one end of the housing 18, in the embodiment illustrated in FIG. 1, to the negative or end cap 24 end of the housing 18. The reusable battery indicator 40 includes an integrated circuit, which may be incorporated into a printed circuit board (PCB) 42, which is sandwiched between a first connector 44 that is electrically connected to the PCB 42, and a retainer 46 that is electrically connected to the PCB 42. In one embodiment, the PCB 42 is a multi-layered insulator/conductive structure which can be a rigid epoxy, FR4 phelonic with bonded copper traces or a flexible polyester, polyamide with bonded copper traces. The PCB 42 may have a generally annular shape, as illustrated in FIG. 1, and the PCB 42 may extend into a flexible PCB 43, which extends along an outer surface of the housing 18, generally away from the first connector 44 and from the retainer 46. At one end of the flexible PCB 43, additional electrical components may be located, such as a chip antenna 45, an IC, an IC with integral antenna, or passive components. Placing some electrical components, such as the antenna 45, at one end of the flexible PCB 43 may provide a more advantageous location for certain electrical components. For example, locating the antenna 45 at one end of the flexible PCB 43 may provide better transmission characteristics than locating the antenna closer to the first connector 44 and to the retainer 46. In other embodiments, the antenna 45 may also be an integral part of the flexible PCB 43 or of the rigid PCB 42 formed as part of the copper trace layer.

The first connector 44 may be removably and electrically connected to the end cap 24 to form a negative electrical connection and the retainer 46 may be removably and electrically connected to the housing 18, which generally has a positive electrical charge, to form a positive electrical connection. The first connector 44 and the retainer 46 may take virtually any physical form that allows the first connector 44 and the retainer 46 to form electrical connections with the battery cell 10 and the PCB 42 and that does not impede normal device terminal access. The first connector 44 and the retainer 46 may be formed from virtually any material that transmits analog information, such as electrical information, from the battery cell to the PCB 42. For example, in some embodiments, the first connector 44 and retainer 46 may be formed from one or more of the following materials, a metal, a metal alloy, cold-rolled steel, hard drawn ferrous and non-ferrous alloys, high and low carbon steel alloys, post or pre-plated ferrous and non-ferrous alloys, carbon, or any combination thereof. In some embodiments, at least one of the first connector 44 and the retainer 46 may comprise a metal and an insulator. The insulator may be a non-conductive coating (such as a polymer layer, epoxy or passivate) applied to the connector/retainer or an additional insulator ring (paper, phenolic or polymer).

Generally, the integrated circuit receives electrical information, such as amperes or volts from the first connector 44 and from the retainer 46, and the electrical information is used by the integrated circuit to calculate battery characteristic information, such as power or charge level, and the integrated circuit then transmits the battery characteristic information to a receiver, such as a computer, a smart phone, or a personal digital assistant, for use by the consumer. In this way, the reusable battery indicator 40 allows a consumer to acquire the battery characteristic information without removing the battery cell from an electronic device (or from a package). The first connector 44 and the retainer 46 deliver the electrical information to the integrated circuit without interfering with electrical contacts between the battery cell and the electronic device. Furthermore, the reusable battery indicator 40 is movable from one battery cell to another battery cell so as to be reused over and over again, thereby reducing the overall cost to a consumer.

Figure 2:
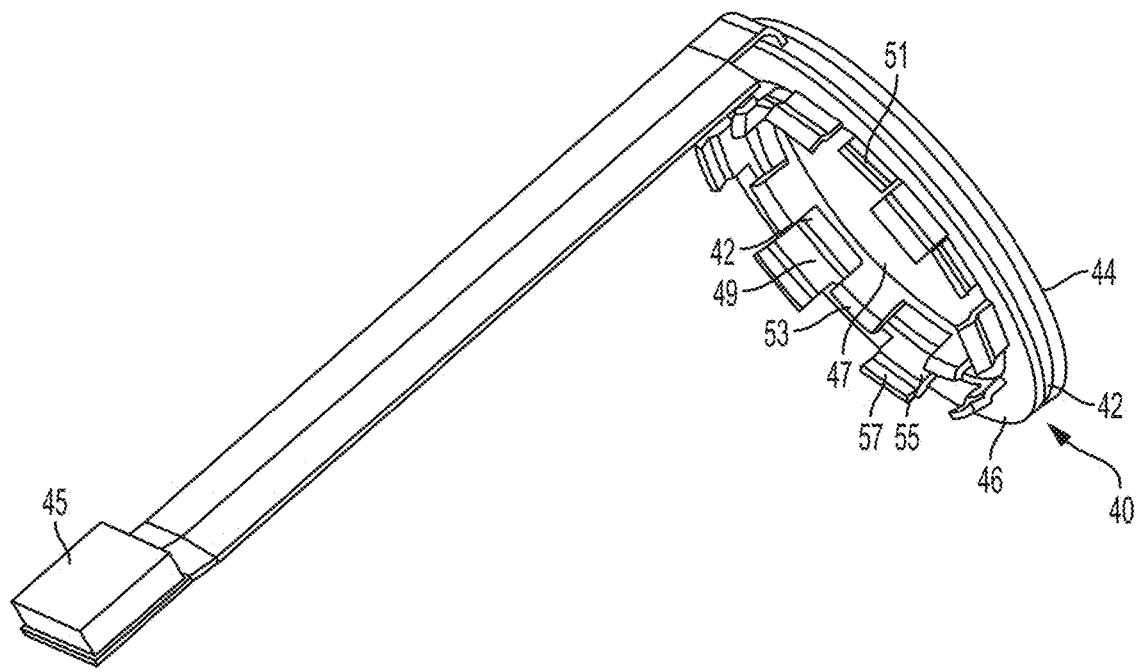
FIG. 2 is a bottom perspective view of the reusable battery indicator of FIG. 1.

Referring to FIG. 2, the reusable battery indicator 40 is illustrated in more detail. The first connector 44 is annularly shaped and located on an opposite side of the PCB 42 from the retainer 46, which is also annularly shaped. The first connector 44 includes a central opening 47, which is sized and shaped to surround a raised central portion of the end cap 24. Similarly, the retainer 46 includes a central opening 49 that is sized and shaped to surround the raised central portion of the end cap 24. Thus, the first connector 44, the PCB 42, and the retainer 46 form a ring-shaped (or annularly-shaped) sandwich structure that is sized to fit on one end (the negative end) of the battery cell 10.

The first connector 44 includes a plurality of connector tabs 51. The connector tabs 51 extend away from the first connector 44 and towards the retainer 46. The connector tabs 51 are spaced radially inward (towards a center of the central opening 47) from the retainer 46. More specifically, the connector tabs 51 are separated from the retainer 46 by the PCB 42. The connector tabs 51 are arranged to contact the end cap 24 of the battery cell 10, as will be further explained below. Additionally, the connector tabs 51 include crimped ends 53, which facilitate a removable connection with the end cap 24.

The retainer 46 includes a plurality of retainer tabs 55. The retainer tabs 55 extend away from the first connector 44. The retainer tabs 55 are spaced radially outward (away from a center of the central opening 59). More specifically, the retainer tabs 55 are separated from the first connector 44 by the PCB 42. The retainer tabs 55 are arranged to contact the can or housing 18 of the battery cell 10, as will be further explained below. Additionally, the retainer tabs 51 include crimped ends 57, which facilitate a removable connection with the housing 18.

Figure 3:
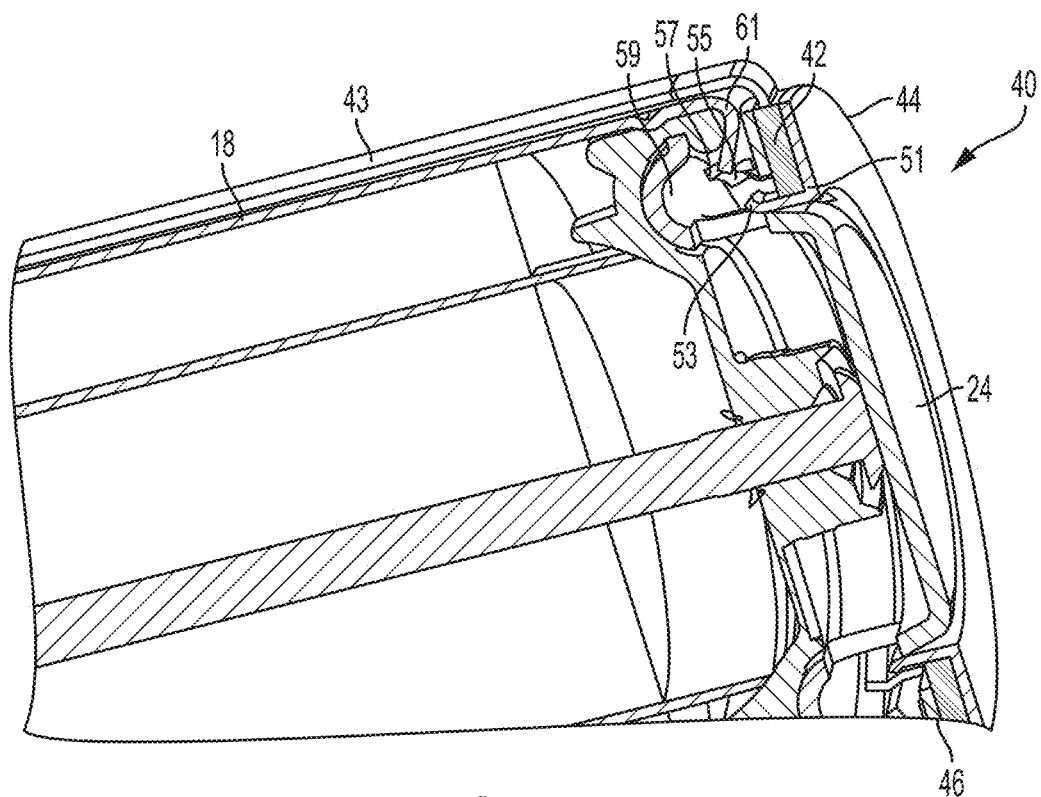
FIG. 3 is side cross-sectional view of the reusable battery indicator and battery cell of FIG. 1.

Referring now to FIG. 3, the PCB 42 is radially thicker than the retainer 46. As a result, the retainer tabs 55 are located radially outward of the connector tabs 51. The retainer tabs 55 extend into a can void 59 that is formed between a crimped wall 61 of the housing 18 and the end cap 24. As the battery indicator 40 is pressed onto the end cap 24, the crimped ends 57 of the retainer tabs 55 are pushed radially inward until the crimped ends 57 pass over an end of the crimped wall 61 of the housing 18, at which point, the crimped ends 57 expand radially outward to removably lock the retainer 46 in place on the end of the housing 18 and to provide a positive electrical connection (because the housing carries a positive charge).

Similarly, the connector tabs 51 extend into the can void 59, but the connector tabs 51 are located against the end cap 24. As the battery indicator 40 is pressed onto the end cap, the connector tabs 51 are pushed radially outward, which maintains physical contact between the connector tabs 51 and the end cap to provide a negative electrical connection (because the end cap carries a negative charge). As a result, the PCB 42 receives electrical information (e.g., volts and amperes) through the connector tabs 51 and through the retainer tabs 55.

Figure 4:
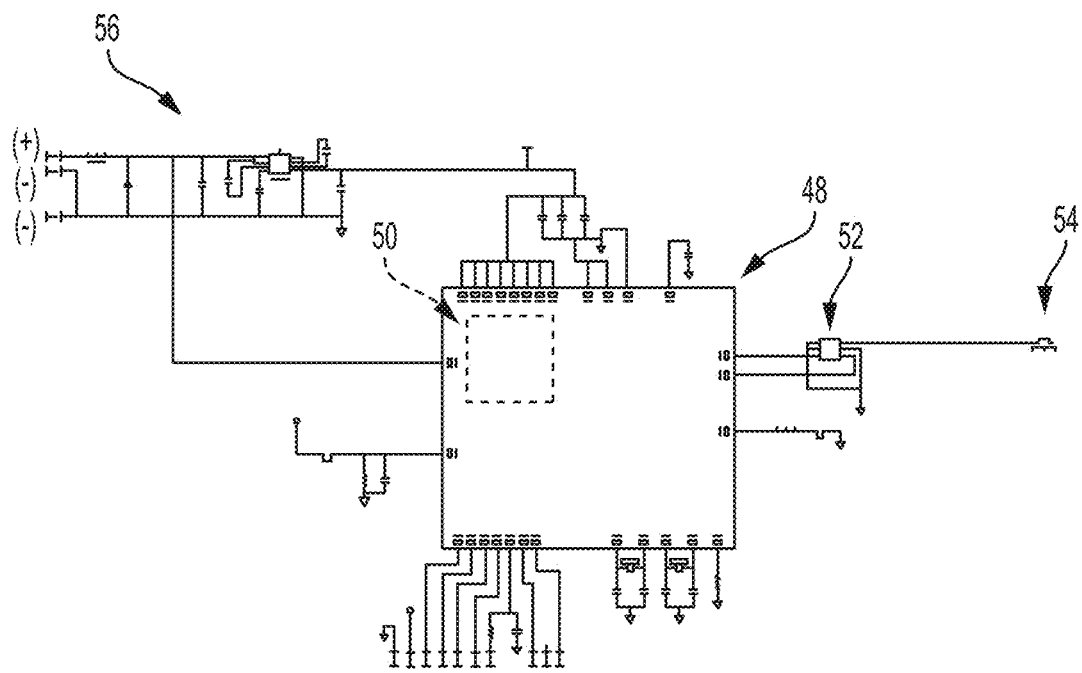
FIG. 4 is an electronic circuit schematic diagram of the reusable battery indicator of FIG. 1.
Figure 5:
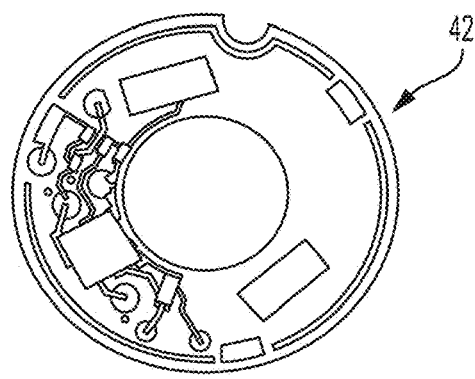
FIG. 5 is a top plan view of a printed circuit board of the reusable battery indicator of FIG. 1.

Turning now to FIGS. 4 and 5, formed on the PCB 42 is an integrated circuit 48, that includes an embedded voltage sensor 50 within the integrated circuit 48 that is communicatively connected to the first connector 44 and to the retainer 46. The embedded voltage sensor 50 senses analog characteristics of the battery cell, such as amperes and voltage and converts the sensed analog characteristics to digital information. The PCB 42 also includes a communication circuit 52. An antenna 54 is operatively coupled to the communication circuit 52. The communication circuit 52 may comprise one or more of a radio-frequency identification circuit, a Bluetooth® circuit, a Bluetooth® low energy circuit, a Wi-Fi circuit, a Zigbee® circuit, a LORA circuit, and a Z-wave circuit. In one embodiment, an integrated circuit, such as a wireless Bluetooth Low-Energy voltage sensor, may incorporate the analog to digital converter, a microcontroller, a Bluetooth radio, a memory device, and a DC/DC voltage converter.

A voltage booster 56 is electrically connected to the integrated circuit 48 and the embedded voltage sensor 50. The embedded voltage sensor 50 and the voltage booster 56 are capable of reading the open circuit voltage of the battery that may be, for example, less than 1.8 volts. In some embodiments, the communication circuit 52 may comprise one or more of a thin disc BLE module, a UHF module, or a RF module.

In the embodiment illustrated in FIGS. 4 and 5, the integrated circuit 48, the voltage sensor 50, and the communication circuit 52 are all formed on the PCB 42, which is connected to the first connector 44 and to the retainer 46. However, in other embodiments, the integrated circuit 48, the voltage sensor 50, and the communication circuit 52 may be formed as separate components that are communicatively and operatively connected to one another.

Figure 6:
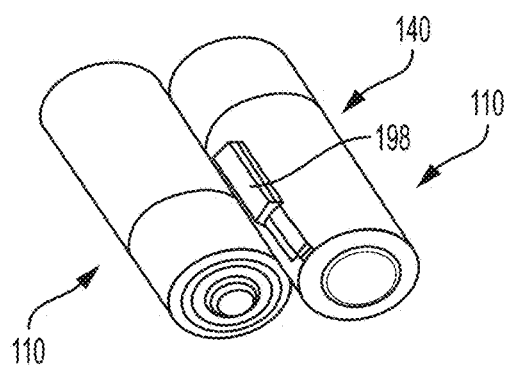
FIG. 6 is an end elevational view of a second embodiment of a reusable battery indicator constructed in accordance with the teachings of the disclosure.

In the embodiment illustrated in FIG. 6, similar elements are numbered exactly 100 greater than elements numbered in FIGS. 1-5. For example, the battery cell is numbered 10 in FIGS. 1-4 and the battery cell is numbered 110 in FIG. 6. Unless stated otherwise, any element from any illustrated embodiment may be incorporated into any other illustrated embodiment.

Turning now to FIG. 6, a second embodiment of the reusable battery indicator 140 is attached to a battery cell 110. The reusable battery indicator 140 is illustrated and located between two battery cells 110. In the embodiment of FIG. 6, the reusable battery indicator 140 includes a housing 198 that has only a single concave side that is able to fit into and up to the entire triangular prism void area delineated by the one or more batteries and the battery receptacle.

Figure 7:
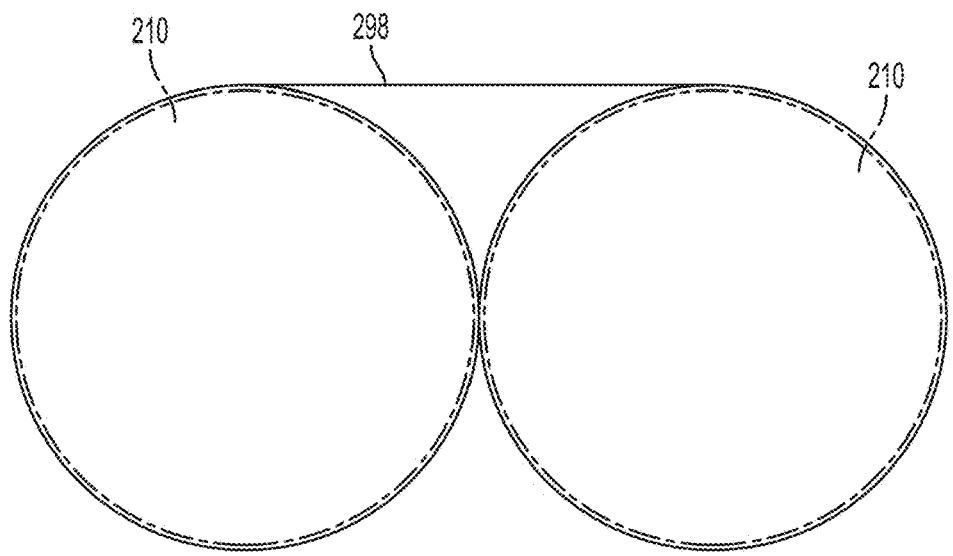
FIG. 7 is an end elevational view of a third embodiment of a reusable battery indicator constructed in accordance with the teachings of the disclosure.

FIG. 7 illustrates an alternative housing shape area for which the reusable battery indicator can fit into. In this embodiment, the housing 298 is arranged to fit in the void formed by two cylindrical battery cells 210 that are arranged side by side and oriented such that the respective longitudinal axes of the battery cells 210 are parallel to one another. In the embodiment illustrated in FIG. 7, the housing 298 has a cross-sectional shape that is defined by the following equation:

$$A_v = (D_B^2 - \Pi/4 \times D_B^2)/2, \text{ where}$$

$A_v$ is the cross-sectional area of the housing 298; and
$D_B$ is a diameter of one battery cell 210.

A housing having a cross-sectional shape defined by the preceding equation maximizes the usable space between the battery cells. For example, a housing having the cross-sectional shape defined above would result in the following housing volumes for the given battery sizes (assuming that the housing length was equal to the battery cell length). For a AAA battery, the housing would have a volume of 526 mm$^3$; and for a AA battery, the housing would have a volume of 1140 mm$^3$.

Figure 8A:
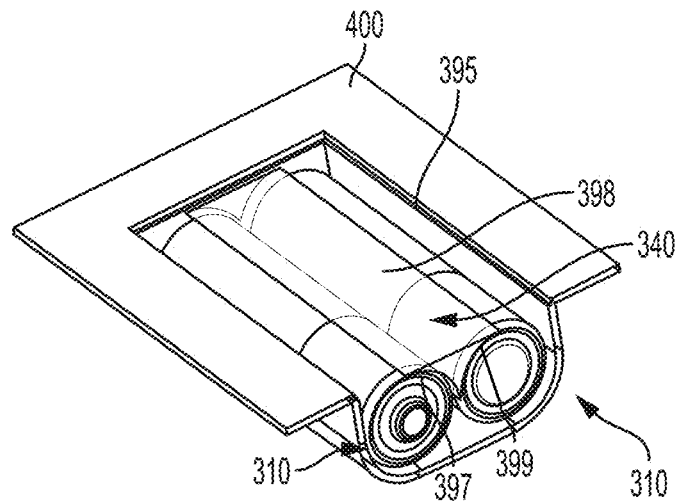
FIG. 8A is a bottom perspective view of a battery compartment of an electronic device including two battery cells and a fourth embodiment of a reusable battery indicator that is connected to one of the battery cells.

Turning now to FIG. 8A, yet another alternative embodiment of a reusable battery indicator 340 is illustrated. In the embodiment of FIG. 8A, the reusable battery indicator includes a housing 398, the integrated circuit, the voltage sensor, and the communication circuit being mounted within the housing 398. In the embodiment of FIG. 8A, the housing 398 is sized and shaped to fit between two cylindrical battery cells 310 that are arranged longitudinally side-by-side. In the embodiment illustrated in FIG. 8A, the housing 398 has a cross-section that is in the shape of a triangular prism. More specifically, the housing 398 has a first side 397 that is concave and a second side 399 that is concave. In the embodiment of FIG. 8A, the reusable battery indicator 340 is mounted between the battery cells 310 and within a battery receptacle 395 of an electronic device 400. In other embodiments, the housing 398 may have any rectangular, trapezoid, elliptical, semi-circular and variable prisms that are able to fit into and up to the entire triangular prism void area delineated by the two cells and the battery receptacle.

Figure 8B:
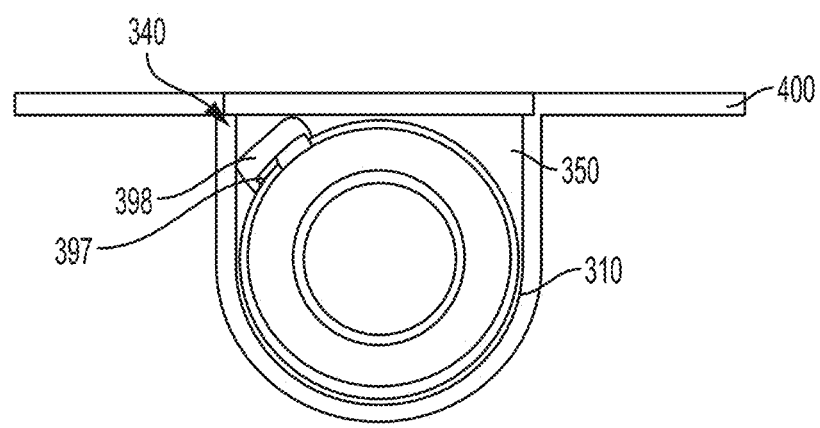
FIG. 8B is a side perspective view of an alternate embodiment of a battery compartment of an electronic device including a single battery cell and a fifth embodiment of a reusable battery indicator that is connected to the battery cell.

Turning now to FIG. 8B, yet another alternative embodiment of a reusable battery indicator 340 is illustrated. In the embodiment of FIG. 8B, the reusable battery indicator includes a housing 398, the integrated circuit, the voltage sensor, and the communication circuit being mounted within the housing 398. In the embodiment of FIG. 8B, the housing 398 is sized and shaped to fit between adjacent to a single cylindrical battery cell 310. In the embodiment illustrated in FIG. 8B, the housing 398 has a cross-section that fits within the cross-section of ½ of a triangular prism, such as a triangular prism described above with respect to FIG. 7. More specifically, the housing 398 has a single side 397 that is concave. In the embodiment of FIG. 8B, the reusable battery indicator 340 is mounted adjacent to the battery cell 310 and within a battery receptacle 395 of an electronic device 400. The housing 398 has a cross-section that fits within a volume defined by the following formula:

Av/2; where $$A_v = (D_B^2 - \Pi/4 \times D_B^2)/2.$$

Figure 9:
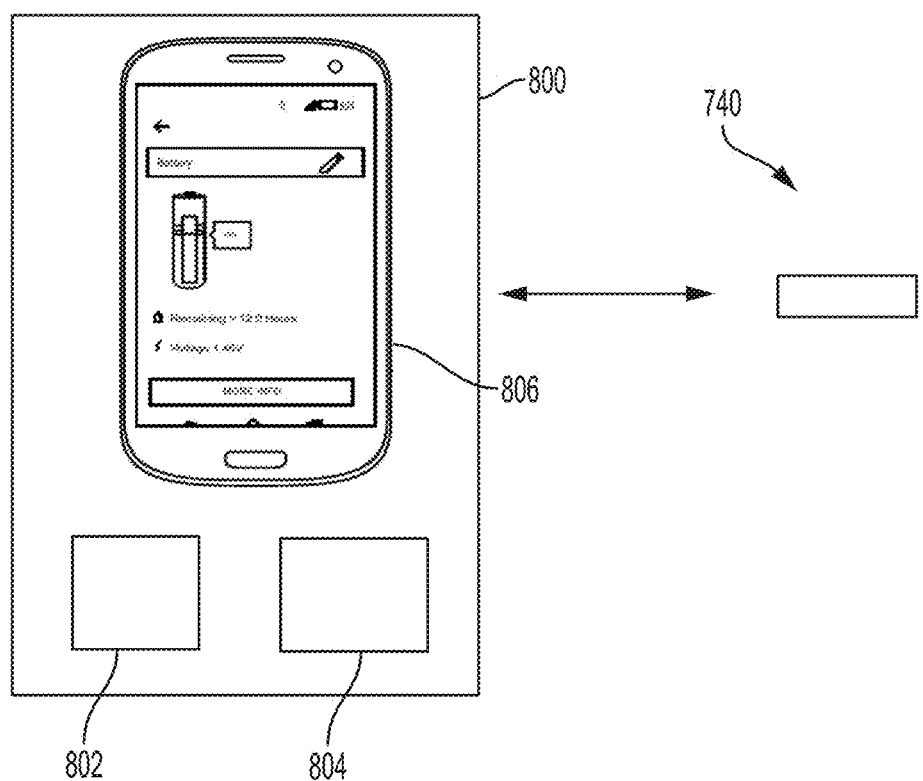
FIG. 9 is a is a schematic diagram of a battery indication system including the reusable battery indicator of FIG. 1

Turning now to FIG. 9, a computing device 800 is communicatively connected to the communication circuit in the reusable battery indicator 740. The computing device receives information from the communication circuit through wireless signals sent by the antenna in the reusable battery indicator 740. For example, the wireless signal may be one or more of a wifi signal, a Bluetooth® signal, a RFID signal, or any other wireless signal. In other embodiments, the computing device 800 and the reusable battery indicator 740 may communicatively connected by a wired connection.

The computing device 800 includes a processor 802 and a memory 804. The memory 804 may store processor executable instructions that when executed by the processor 802 cause the processor 802 to detect a wireless communication signal from the reusable battery indicator 740. In some embodiments the memory 804 may comprise a non-transitory computer readable medium with the processor executable instructions embedded thereon as an article of manufacture. The processor executable instructions may also cause the processor 802 to send wireless signals back to the reusable battery indicator 740 to remotely control battery circuitry through the reusable battery indicator 740. In this manner, the processor 802 may cause the reusable battery indicator 740 to determine battery characteristic data; and to send the battery characteristic data to a user interface, such as a display 806 on the computing device 800.

In some embodiments, the battery characteristic data may comprise at least one of an electrical capacity; a voltage; an impedance, a temperature, a current; an age, a charge/discharge cycle count, and a coulomb count.

In other embodiments, the processor executable instructions, when executed by the processor 802, causes the processor 802 to determine at least one of a battery type, a physical location of the battery, and an electrical device that the battery is powering by communicating with the reusable battery indicator 740.

Figure 10A:
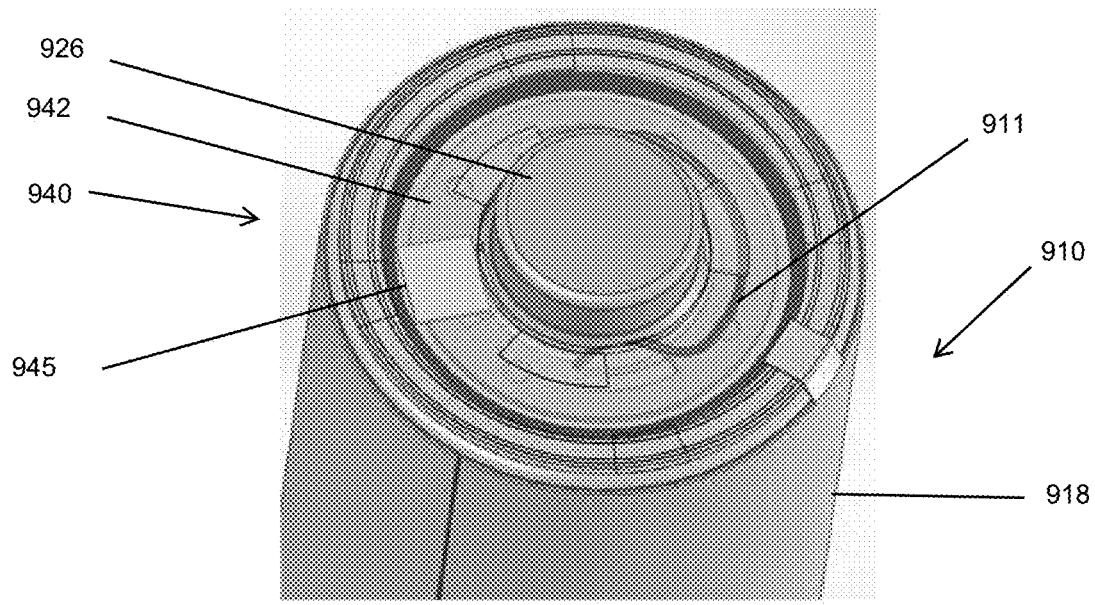
FIG. 10A is a perspective (and partially transparent) view of a fourth embodiment of a reusable battery indicator constructed in accordance with the teachings of the disclosure connected to a battery cell.
Figure 10B:
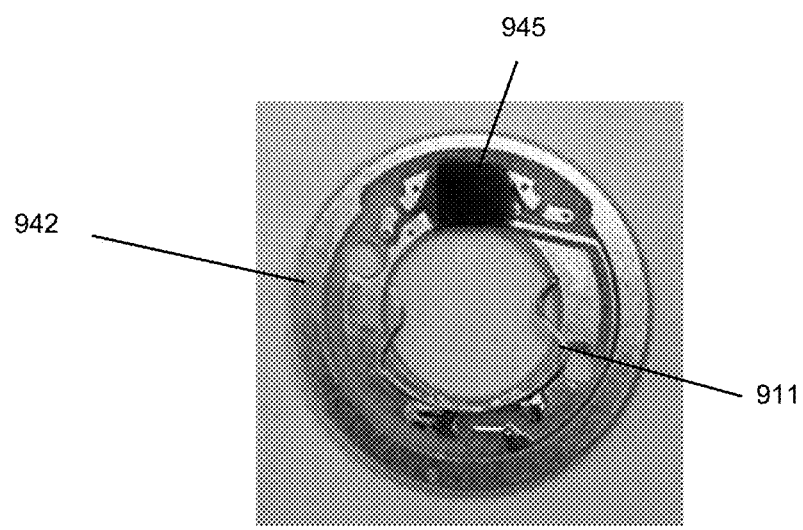
FIG. 10B is a top plan view of the reusable battery indicator of FIG. 10A.

FIGS. 10A and 10B illustrate yet another embodiment of a reusable battery indicator 940. The reusable battery indicator 940 may be used on battery cells 910 having a negatively charged housing 918 and a positively charged pip 926. Such battery cells include, but are not limited to, a lithium-ion battery a nickel metal hydride (NiMH) battery, a nickel cadmium (NiCad) battery, a silver/zinc battery, a nickel/zinc battery, or a lithium solid state rechargeable battery. These types of batteries have battery housings that carry a negative charge. The reusable battery indicator includes an annular PCB 942 that fits over the positive pip 926. The PCB 942 may include a transmitter or antenna 945. A connection mechanism, such as a wire clip 911 may secure the PCB 942 to a battery vent in the positive pip 926.

Figure 11A:
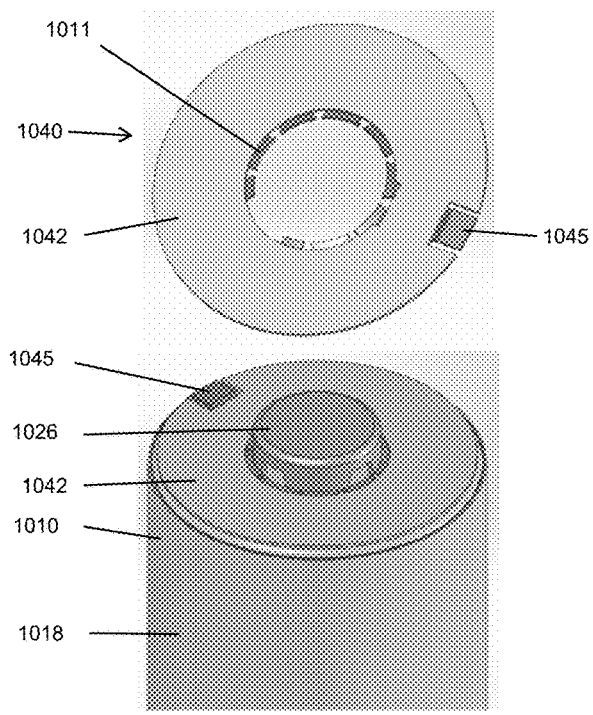
FIG. 11A is a top perspective view of a fifth embodiment of a reusable battery indicator constructed in accordance with the teachings of the disclosure connected to a battery cell and a top view of the reusable battery indicator elevated above the battery cell.
Figure 11B:
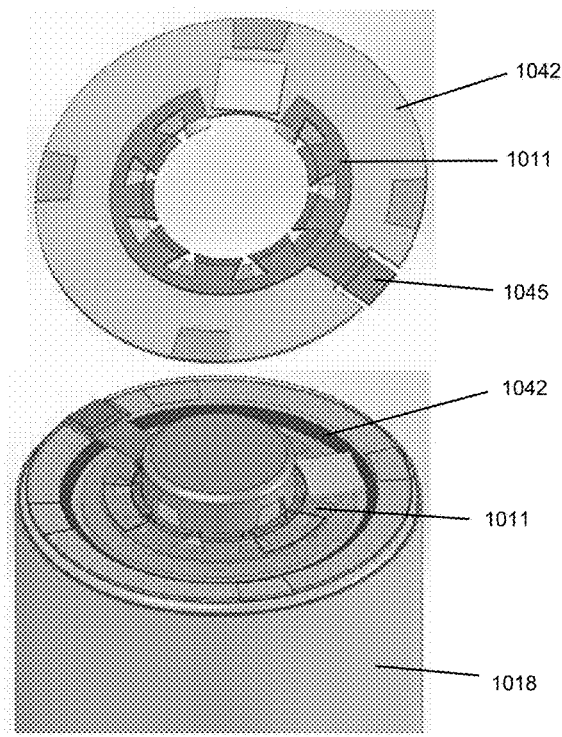
FIG. 11B is a top perspective (and partially transparent) view of the reusable battery indicator of FIG. 11A connected to the battery cell and a bottom view of the reusable battery indicator elevated above the battery cell.

FIGS. 11A and 11B illustrate yet another embodiment of a reusable battery indicator 1040. The reusable battery indicator 1040 may be used on battery cells 1010 having a negatively charged housing 1018 and a positively charged pip 1026. Such battery cells include, but are not limited to, a lithium-ion battery a nickel metal hydride (NiMH) battery, a nickel cadmium (NiCad) battery, a silver/zinc battery, a nickel/zinc battery, or a lithium solid state rechargeable battery. These types of batteries have battery housings that carry a negative charge. The reusable battery indicator includes an annular PCB 1042 that fits over the positive pip 1026. The PCB 1042 may include a transmitter or antenna 1045. A connection mechanism, such as a clip 1011 may secure the PCB 1042 to a battery vent in the positive pip 1026.

Figure 12A:
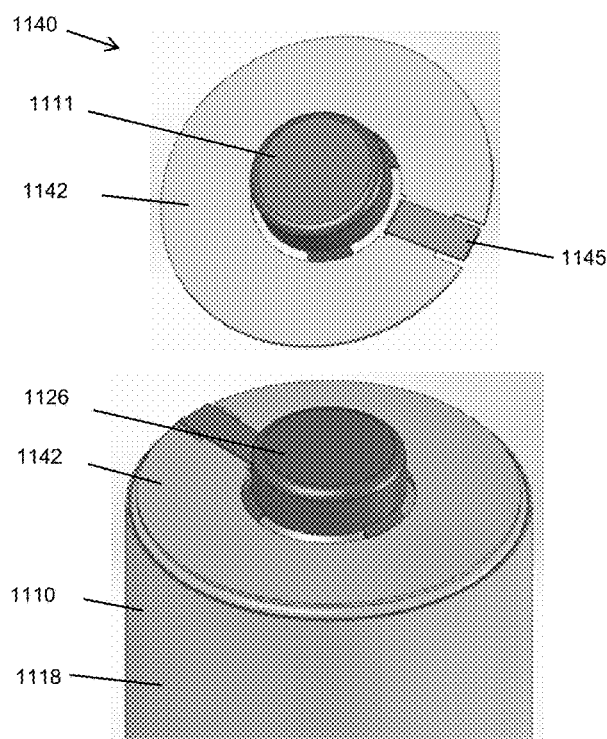
FIG. 12A is a top perspective view of a sixth embodiment of a reusable battery indicator constructed in accordance with the teachings of the disclosure connected to a battery cell and a top view of the reusable battery indicator elevated above the battery cell.
Figure 12B:
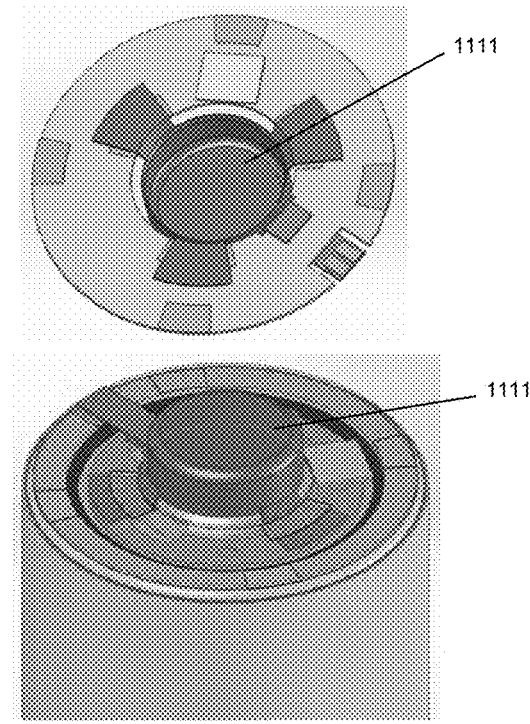
FIG. 12B is a top perspective (and partially transparent) view of the reusable battery indicator of FIG. 12A connected to the battery cell and a bottom view of the reusable battery indicator elevated above the battery cell

FIGS. 12A and 12B illustrate yet another embodiment of a reusable battery indicator 1140. The reusable battery indicator 1140 may be used on battery cells 1110 having a negatively charged housing 1118 and a positively charged pip 1126. Such battery cells include, but are not limited to, a lithium-ion battery a nickel metal hydride (NiMH) battery, a nickel cadmium (NiCad) battery, a silver/zinc battery, a nickel/zinc battery, or a lithium solid state rechargeable battery. These types of batteries have battery housings that carry a negative charge. The reusable battery indicator includes an annular PCB 1142 that fits over the positive pip 1126. The PCB 1142 may include a transmitter or antenna 1145. A connection mechanism, such as a pip cap 1111 may secure the PCB 1142 to a battery vent in the positive pip 1126.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm."

Every document cited herein, including any cross referenced or related patent or application and any patent application or patent to which this application claims priority or benefit thereof, is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. A reusable battery indicator comprising:
   a voltage sensor configured to convert sensed analog characteristics of a battery to digital information;
   a communication circuit communicatively connected to the voltage sensor;
   an antenna operatively coupled to the communication circuit; and
   a connection mechanism having a first connector and a retainer, the first connector and the retainer being electrically connected to the voltage sensor and the first connector and the retainer both being located at the same end of the reusable battery indicator, the first connector being adapted to be removably connected to a first battery terminal, thereby providing an electrical connection between the voltage sensor and the first battery terminal when the first connector is connected to the first battery terminal, and the retainer being adapted to removably secure the voltage sensor to a can of a battery, thereby providing an electrical connection between the voltage sensor and the can of the battery, the retainer comprising a plurality of retainer tabs that extend away from the first connector,
   wherein an electrical circuit is completed between the voltage sensor and the first battery terminal and between the voltage sensor and the can when the connection mechanism is coupled to the first battery terminal and to the can.

2. The reusable battery indicator of claim 1, wherein the first connector is connected to a negative electrode of the battery and the retainer is connected to a positive electrode of the battery.

3. The reusable battery indicator of claim 1, wherein the first connector is one of a formed spring, a Kelvin connection, a split wire, a leaf spring, or combinations thereof.

4. The reusable battery indicator of claim 1, further comprising a voltage booster electrically connected to or incorporated in the voltage sensor.

5. The reusable battery indicator of claim 1, wherein the first connector comprises at least one metal and at least one insulator.

6. The reusable battery indicator of claim 1, wherein the communication circuit comprises at least one of radio-frequency identification circuitry, Bluetooth circuitry, Bluetooth low energy circuitry, Wi-Fi circuitry, Zigbee circuitry, LORA circuitry, or Z-wave circuitry.

7. The reusable battery indicator of claim 1, wherein the voltage sensor is capable of reading an open circuit voltage of less than 1.8 Volts.

8. The reusable battery indicator of claim 1, wherein the voltage sensor and the communication circuit are formed on a printed circuit board that is disposed between the first connector and the retainer.

9. The reusable battery indicator of claim 1, further comprising a housing, the voltage sensor and the communication circuit being mounted within the housing, the housing being sized and shaped to fit between two cylindrical batteries that are arranged side-by-side.

10. The reusable battery indicator of claim 9, wherein the housing has a cross-section that is in the shape of a triangular prism.

11. The reusable battery indicator of claim 10, wherein the housing has one side that is concave.

12. The reusable battery indicator of claim 10, wherein the housing has two sides that are concave.

13. The reusable battery indicator of claim 10, wherein the housing has an available void volume of between about 102 mm$^3$ and about 165 mm$^3$.

14. The reusable battery indicator of claim 1, wherein the voltage sensor is disc-shaped to and arranged to fit one end of a cylindrical battery cell.

15. A remote battery indication system, the system comprising:
a battery; and
a reusable battery indicator, the reusable battery indicator including a voltage sensor configured to convert sensed analog characteristics of a battery to digital information; a communication circuit communicatively connected to the voltage sensor; an antenna operatively coupled to the communication circuit; and a connection mechanism having a first connector and a retainer, the first connector and the retainer being electrically connected to the voltage sensor and the first connector and the retainer both being located at the same end of the reusable battery indicator, the first connector being adapted to be removably connected to a first battery terminal, thereby providing an electrical connection between the voltage sensor and the first battery terminal when the first connector is connected to the first battery terminal, and the retainer being adapted to removably secure the voltage sensor to a can of a battery, thereby providing an electrical connection between the voltage sensor and the can of the battery, when the retainer is connected to the can of the battery,
wherein the first connector is electrically attached to a first battery terminal, so that the voltage sensor senses a characteristic of the battery.

16. The system of claim 15, further comprising a computing device that is communicatively connected to the communication circuit, the computing device receiving information from the communication circuit through the antenna.

17. The system of claim 16, wherein the computing device includes a processor and a memory, the memory storing a software routine that causes the processor to detect a wireless communication signal from the reusable battery indicator, to remotely control battery circuitry through the reusable battery indicator to determine battery characteristic data; and to send the battery characteristic data to a user interface.

18. The system of claim 17, wherein the battery characteristic data comprises at least one of an electrical capacity; a voltage; an impedance, a temperature, a current; an age, a charge/discharge cycle count, or a coulomb count.

19. The system of claim 17, wherein the software routine, when executed by the processor, causes the processor to determine at least one of a battery type, a physical location of the battery, or an electrical device that the battery is powering.

* * * * *